United States Patent
Lan et al.

(10) Patent No.: US 8,492,874 B2
(45) Date of Patent: Jul. 23, 2013

(54) HIGH DENSITY METAL-INSULATOR-METAL TRENCH CAPACITOR

(75) Inventors: Je-Hsiung Lan, San Diego, CA (US); Matthew Michael Nowak, San Diego, CA (US); Evgeni P. Gousev, San Jose, AZ (US); Jonghae Kim, San Diego, CA (US); Clarence Chui, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 209 days.

(21) Appl. No.: 13/021,151

(22) Filed: Feb. 4, 2011

(65) Prior Publication Data

US 2012/0199949 A1    Aug. 9, 2012

(51) Int. Cl.
| | |
|---|---|
| *H01G 4/10* | (2006.01) |
| *H01G 4/12* | (2006.01) |
| *H01L 23/5222* | (2006.01) |
| *H01L 28/82* | (2006.01) |
| *H01L 29/945* | (2006.01) |
| *H01L 23/642* | (2006.01) |

(52) U.S. Cl.
USPC ........................................................ 257/534

(58) Field of Classification Search
USPC ............ 257/532, 534, 324, E21.21, 296–313, 257/533, 595–602, 923–924, E27.03–E27.035, 257/E27.037–E27.038, E27.041–E27.045, 257/E27.047–E27.048, E27.071, E27.09, 257/E27.092–E27.093, E27.095, E27.101, 257/E27.114–E27.116, E21.008–E21.021, 257/E21.364, 314–326, E27.078, 257/E29.3–E29.309, E21.179–E21.182, 257/E21.422, E21.423, E21.679–E21.694; 438/591, 637, 171, 190, 210, 238–253, 438/329–379, 387, 444, 901, 90
See application file for complete search history.

(56) References Cited

U.S. PATENT DOCUMENTS

| | | | |
|---|---|---|---|
| 4,534,623 A | 8/1985 | Araki | |
| 5,155,657 A | 10/1992 | Oehrlein et al. | |
| 5,160,987 A | 11/1992 | Pricer et al. | |
| 5,753,948 A | 5/1998 | Nguyen et al. | |
| 5,976,945 A * | 11/1999 | Chi et al. | 438/386 |
| 6,204,141 B1 * | 3/2001 | Lou | 438/386 |
| 6,222,722 B1 | 4/2001 | Fukuzumi et al. | |
| 6,387,750 B1 | 5/2002 | Lai et al. | |
| 6,596,602 B2 | 7/2003 | Lizuka et al. | |

(Continued)

FOREIGN PATENT DOCUMENTS

| | | |
|---|---|---|
| EP | 0779656 A2 | 6/1997 |
| WO | 2007054858 A2 | 5/2007 |

OTHER PUBLICATIONS

International Search Report and Written Opinion—PCT/US2012/023999—ISA/EPO—Jul. 16, 2012.

*Primary Examiner* — Dao H Nguyen
*Assistant Examiner* — Tram H Nguyen
(74) *Attorney, Agent, or Firm* — Michelle Gallardo

(57) ABSTRACT

Higher capacitance density is achieved by increasing a surface area of a capacitor. A larger surface area may be obtained by forming isotropic ball shapes (a concave surface) in the trenches on the semiconductor die. The concave surfaces are fabricated by depositing bilayers of amorphous-silicon and silicon oxide. Openings are patterned in the silicon oxide hard mask for trenches. The openings are transferred to the amorphous-silicon layers through isotropic etching to form concave surfaces. Conducting, insulating, and conducting layers are deposited on the concave surfaces of the trenches by atomic layer deposition.

25 Claims, 10 Drawing Sheets

U.S. PATENT DOCUMENTS

| | | |
|---|---|---|
| 7,176,488 B2 | 2/2007 | Kim et al. |
| 7,239,194 B2 * | 7/2007 | Azrai et al. .................. 327/536 |
| 7,270,765 B2 | 9/2007 | Tomonaga et al. |
| 7,635,887 B2 | 12/2009 | Steltenpohl |
| 8,072,024 B2 * | 12/2011 | Ishikawa et al. ............. 257/324 |
| 2002/0019095 A1 * | 2/2002 | Edgar ........................... 438/243 |
| 2002/0175329 A1 | 11/2002 | Hirano |
| 2003/0052088 A1 | 3/2003 | Khan et al. |
| 2003/0068867 A1 | 4/2003 | Forster et al. |
| 2005/0026360 A1 * | 2/2005 | Geusic et al. ................. 438/243 |
| 2007/0117313 A1 | 5/2007 | Yang et al. |
| 2007/0273005 A1 | 11/2007 | Hwang |
| 2008/0173932 A1 * | 7/2008 | Kidoh et al. .................. 257/324 |
| 2008/0305604 A1 | 12/2008 | Lin |
| 2009/0283819 A1 * | 11/2009 | Ishikawa et al. ............. 257/324 |
| 2010/0230787 A1 | 9/2010 | Guiraud et al. |
| 2010/0258904 A1 | 10/2010 | Li et al. |
| 2012/0146182 A1 * | 6/2012 | Oganesian et al. ........... 257/532 |

* cited by examiner

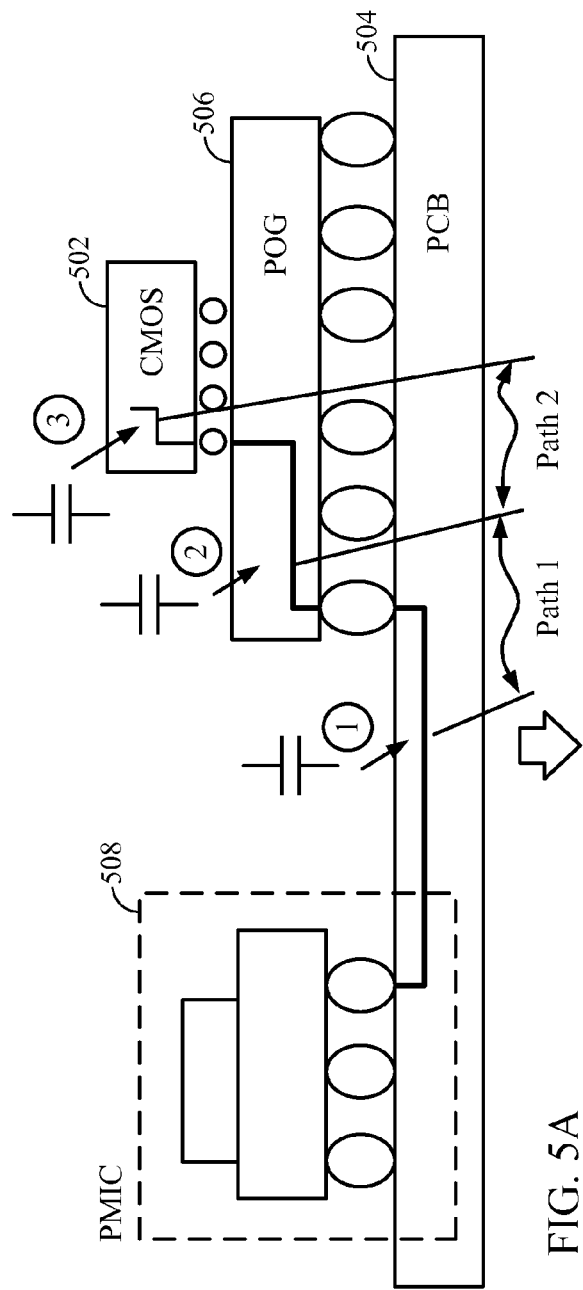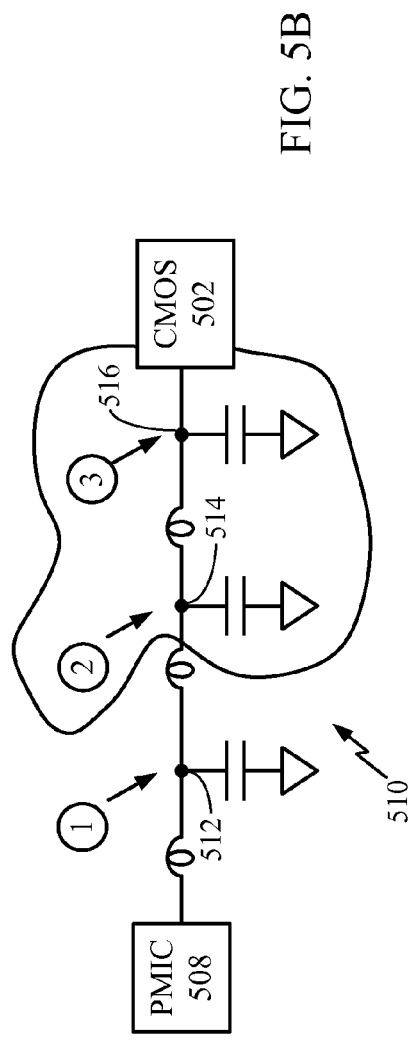
FIG. 5A
FIG. 5B

HIGH DENSITY METAL-INSULATOR-METAL TRENCH CAPACITOR

TECHNICAL FIELD

The present disclosure generally relates to integrated circuits. More specifically, the present disclosure relates to packaging integrated circuits.

BACKGROUND

Metal-insulator-metal (MIM) capacitors are frequently employed in semiconductor dies to provide capacitance to circuitry on the semiconductor die. For example, MIM capacitors are added to semiconductor dies having radio frequency (RF) circuitry to provide by-pass capacitance. RF circuitry is commonly found in devices such as cellular phones. FIG. 1 is a cross-sectional view illustrating a conventional MIM capacitor structure on a semiconductor die.

A MIM capacitor 110 is deposited in trenches 120 of an insulator 104 on a substrate 102. The MIM capacitor 110 includes a metal layer 112, a dielectric layer 114, and a metal layer 116. The dielectric layer 114 separates the metal layer 112 from the metal layer 116. The metal layers 112, 116 are electrodes of the MIM capacitor 110.

Capacitance in a MIM capacitor, such as the MIM capacitor illustrated in FIG. 1, is proportional to the area of the metal electrodes and the thickness of the dielectric layer. The form factor of semiconductor devices is decreasing in size to meet consumer demand for smaller, more portable electronic devices, such as cellular phones. As devices shrink in size, the area available for MIM capacitors decreases resulting in a loss of capacitance. Additionally, the dielectric thickness decreases, resulting in further loss of capacitance.

Thus, there is a need for higher capacitance structures for MIM capacitors.

BRIEF SUMMARY

Illustrative embodiments of the present disclosure include high capacitance structures for metal-insulator-metal (MIM) capacitors. In one aspect of the present disclosure, an apparatus includes a substrate, a first layer coupled to the substrate having a number of trenches patterned in the first layer, the trenches each having a concave surface. A capacitor may be formed in at least one of the trenches. In the illustrative embodiment, the capacitor includes a first conducting layer in the trenches, a first insulating layer on the first conducting layer; and a second conducting layer on the first insulating layer.

According to a further aspect of the disclosure, the capacitor may also include a second insulating layer on the second conducting layer; and a third conducting layer on the second insulating layer. The first layer may include a first semiconductor layer coupled to the substrate; and a first insulating layer on the first semiconductor layer, in which the trenches extend into the first semiconductor layer and the first insulating layer. The first layer may also include a second semiconductor layer on the first insulating layer and a second insulating layer on the second semiconductor layer. The trenches may extend into the second semiconductor layer and the second insulating layer. The first semiconductor layer may be an amorphous silicon layer and the first insulating layer may be a silicon dioxide layer, for example.

According to another aspect of the disclosure, the substrate may be a glass substrate. A semiconductor die including a first portion of a conductive path may be coupled to the capacitor. A printed circuit board including a second portion of the conductive path may be coupled to the capacitor. The capacitor may be configured as a bypass capacitor on the conductive path.

According to illustrative embodiments of the disclosure, the capacitor may be integrated into a mobile phone, a set top box, a music player, a video player, an entertainment unit, a navigation device, a computer, a hand-held personal communication systems (PCS) unit, a portable data unit, a fixed location data unit, and/or a Mirasol display.

Another aspect of the disclosure provides a method including depositing a first layer on a substrate, patterning a number of trenches in the first layer with concave surfaces on the number of trenches, and depositing a capacitor in at least one of the trenches. Depositing the first layer includes depositing a number of bilayers having an amorphous silicon layer and an insulating layer. Patterning the number of trenches includes isotropically etching the amorphous silicon layer to form the concave surfaces on the trenches.

Depositing the capacitor may include depositing a first conducting layer on the trenches, depositing a first insulating layer on the first conducting layer; and depositing a second conducting layer on the first insulating layer. In an illustrative embodiment, the method may also include depositing a second insulating layer on the second conducting layer and depositing a third conducting layer on the second insulating layer.

According to another aspect of the disclosure the substrate may be a glass substrate. The method includes coupling a semiconductor die including a first portion of a conductive path to the capacitor, and coupling a printed circuit board including a second portion of the conductive path to the capacitor. The method may further include configuring the capacitor as a bypass capacitor on the conductive path.

Illustrative embodiments include methods for integrating the capacitor into a mobile phone, a set top box, a music player, a video player, an entertainment unit, a navigation device, a computer, a hand-held personal communication systems (PCS) unit, a portable data unit, a fixed location data unit, and/or a Mirasol display.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 5A is a block diagram showing an exemplary application of a high density (HD) trench MIM capacitor according to an aspect of the present disclosure.

FIG. 5B is a schematic diagram of a conductive path on the exemplary application shown in FIG. 5A according to one embodiment.

DETAILED DESCRIPTION

Higher density capacitance MIM structures may be fabricated in electronic devices by increasing the surface area of metal electrodes in the MIM capacitor. According to one embodiment, a surface area of the metal electrodes in a MIM capacitor is increased with isotropic ball shapes formed in the trenches before deposition of the MIM capacitor.

Figure 1:
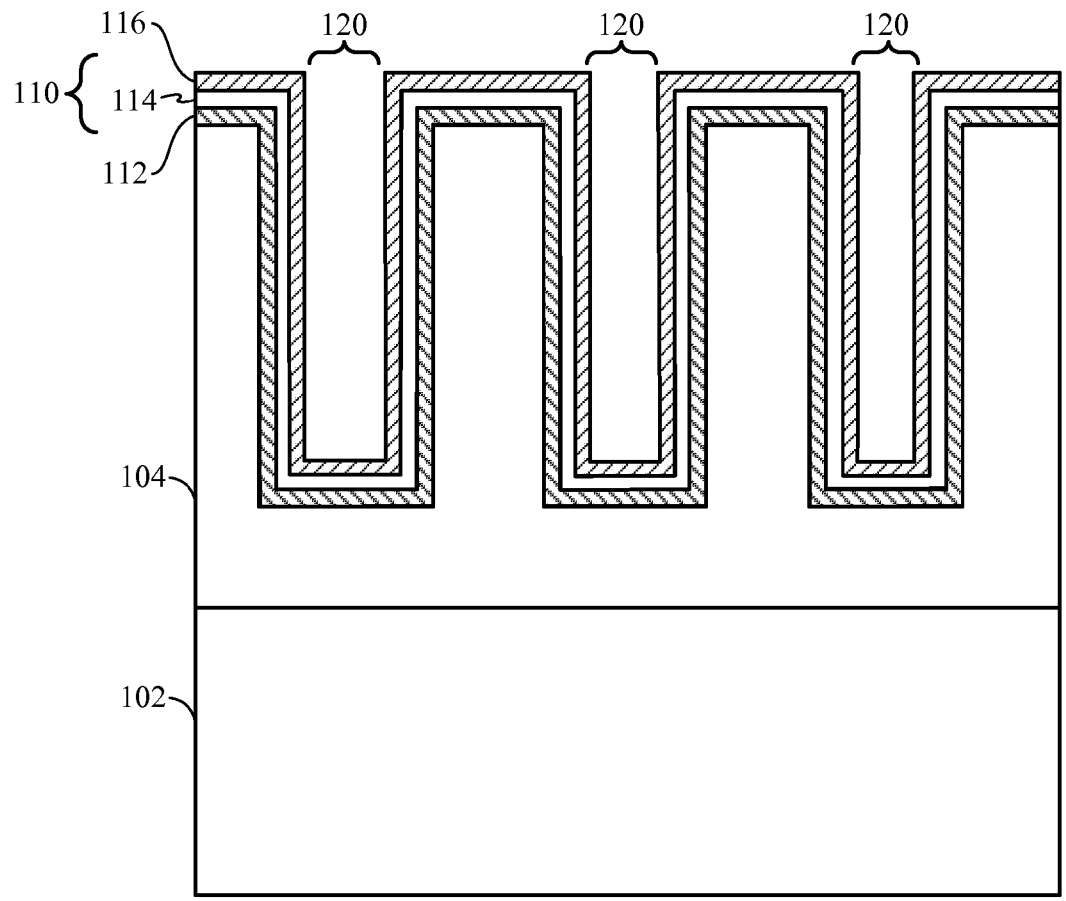
FIG. 1 is a cross-sectional view illustrating a conventional trench MIM capacitor structure on a semiconductor die.
Figure 2:
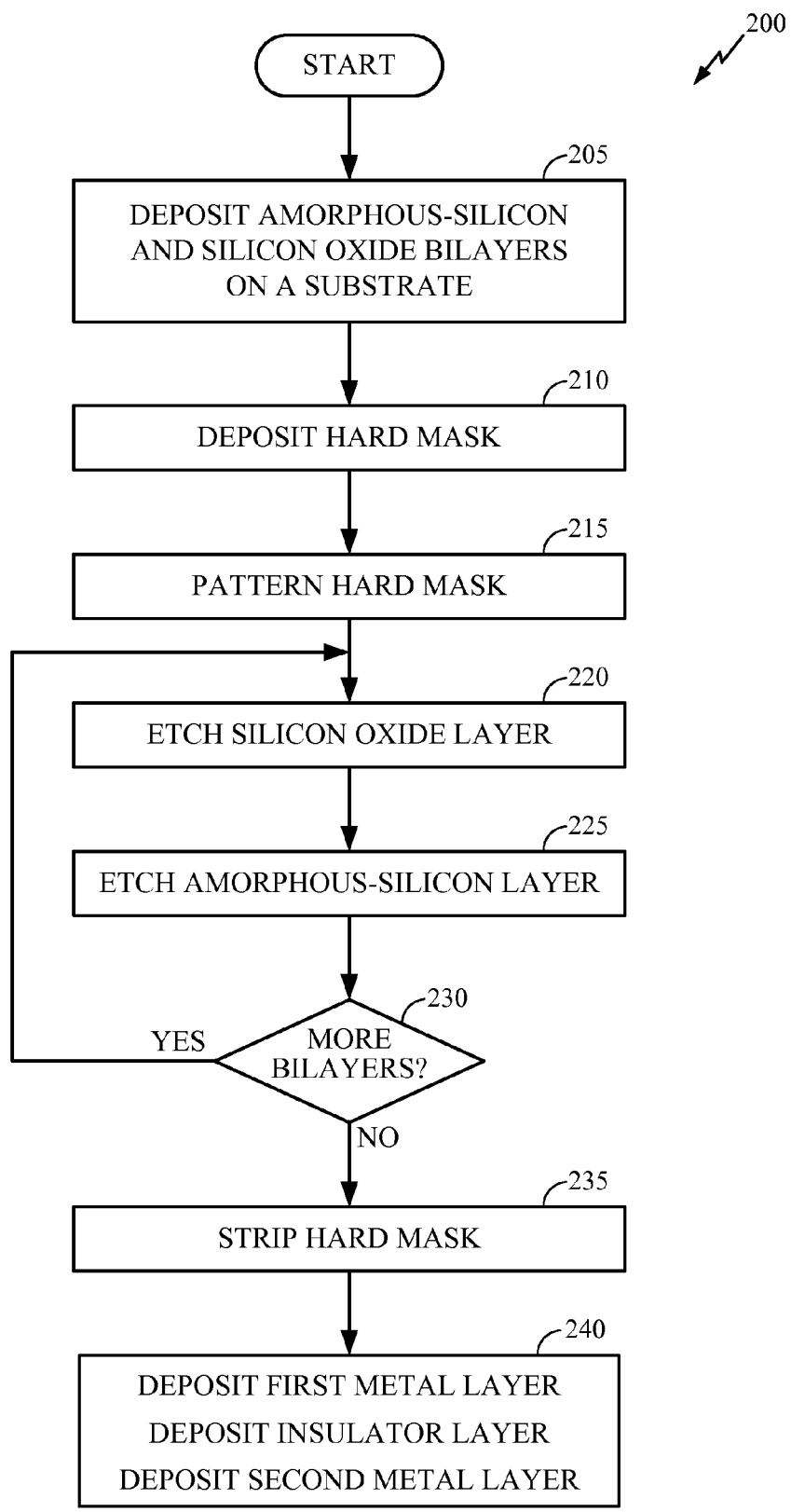
FIG. 2 is a flow chart illustrating an exemplary method for fabricating high density (HD) trench MIM capacitor structures according to one embodiment.

FIG. 2 is a flow chart illustrating an exemplary method for fabricating high density MIM structures according to one embodiment. FIGS. 3A-3H are cross-sectional views of an exemplary MIM structure according to one embodiment. FIGS. 3A-3H will be presented along with the flow chart of FIG. 2 to illustrate the exemplary method of FIG. 2.

Figure 3A:
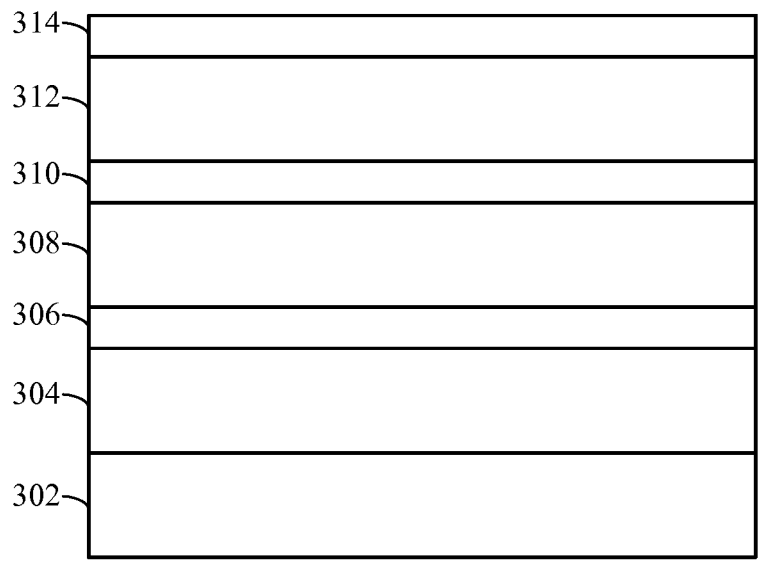
FIGS. 3A-3H are cross-sectional views of an exemplary HD-MIM structure according to one embodiment.

A flow chart 200 starts at block 205 with depositing a number of amorphous-silicon (a-Si)/silicon dioxide ($SiO_2$) bilayers on a substrate. FIG. 3A is a cross-sectional view illustrating an exemplary layer structure after depositing the bilayers according to one embodiment. A bilayer of an amorphous silicon layer 304 and a silicon dioxide layer 306 is deposited on a substrate 302. According to one embodiment, the bilayer is an epitaxial structure. The substrate 302 may be, for example, silicon, glass, aluminum oxide, magnesium oxide, or alkaline earth boro-aluminasilicate, or gallium-arsenide, indium-phosphite, or a silicon-carbide compound semiconductor substrate. Additional bilayers may be deposited on the substrate 302. For example, an amorphous silicon layer 308, a silicon dioxide layer 310, an amorphous silicon layer 312, and a silicon dioxide layer 314 may be deposited on the substrate 302.

Although amorphous-silicon/silicon dioxide bilayers are discussed with reference to FIGS. 2 and 3, other bilayer materials are possible. For example, the amorphous-silicon layers 304, 308, 312 may be replaced by other materials that etch isotropically and the silicon dioxide layers 306, 310, 314 may be replaced by other hard mask materials. Conductive materials, such as Aluminum and Molybdenum are also contemplated.

Figure 3B:

At block 210, a hard mask is deposited on the substrate. FIG. 3B is a cross-sectional view illustrating an exemplary layer structure after deposition of a hard mask according to one embodiment. The hard mask 316 deposited on the substrate 302 may be, for example, a metal layer (e.g., Al, or Ti), or a photoresist type of polymer layer.

Figure 3C:
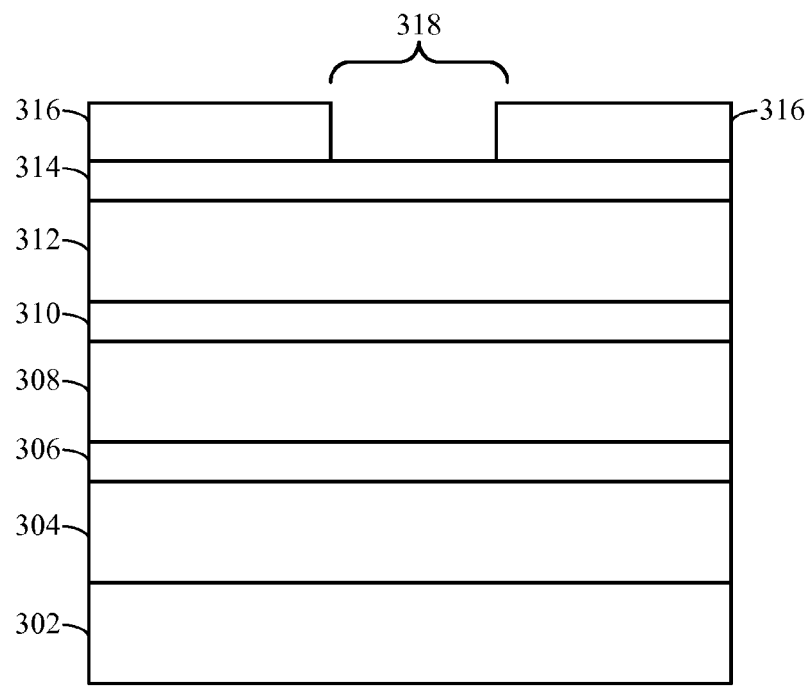

At block 215, the hard mask is patterned with openings for trenches in the bilayers. FIG. 3C is a cross-sectional view of an exemplary layer structure after patterning of the hard mask according to one embodiment. An opening 318 is patterned in the hard mask 316. The opening 318 may correspond to trenches (not yet shown) in the layers 304, 306, 308, 310, 312, 314 for high density capacitance MIM capacitors.

Figure 3D:
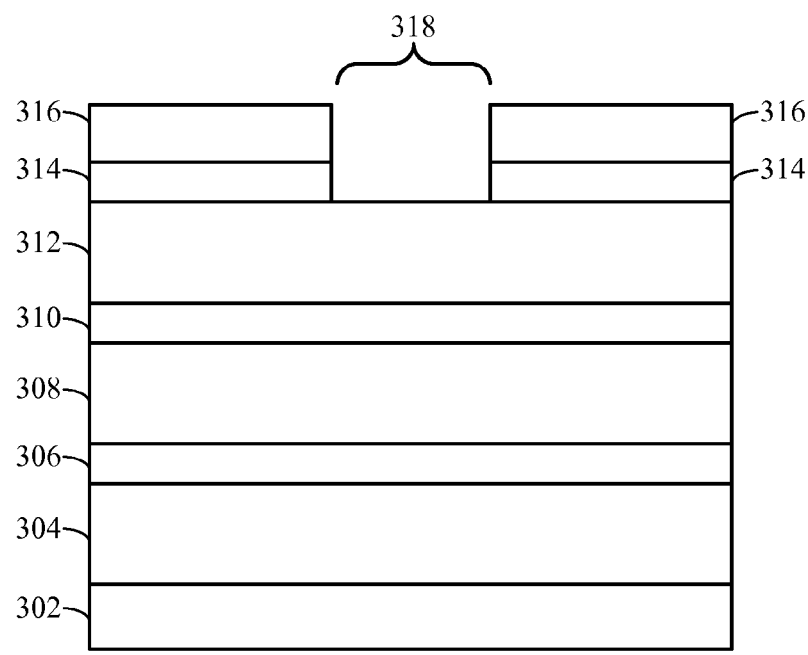

At block 220, a silicon dioxide layer is etched. FIG. 3D is a cross-sectional view of an exemplary layer structure after etching of a silicon dioxide layer according to one embodiment. The opening 318 is transferred to the silicon dioxide layer 314 through, for example, reactive ion etching (RIE).

Figure 3E:
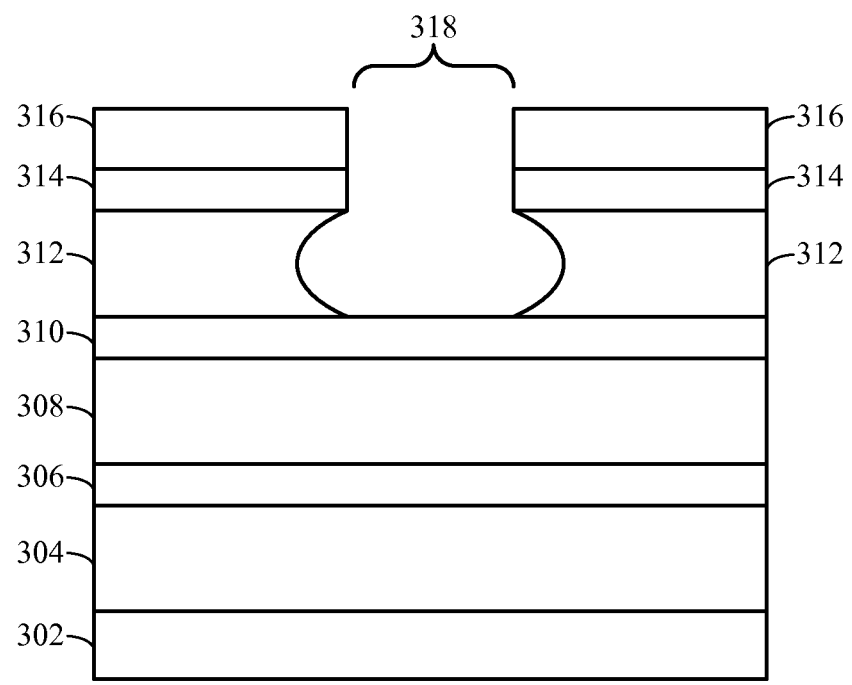

At block 225, an amorphous-silicon layer is etched. FIG. 3E is a cross sectional view of an exemplary layer structure after etching of an amorphous silicon layer according to one embodiment. The opening 318 is transferred to the amorphous-silicon layer 312 by isotropic etching. For example, a wet chemical etch of the amorphous-silicon layer 312 results in an isotropic ball shape on the sidewalls of the opening 318 in the amorphous-silicon layer 312 after etching. The isotropic ball shape in the opening 318 of the amorphous-silicon layer 312 increases the surface area available in a MIM capacitor deposited in the opening 318. According to one embodiment, a xenon difluoride ($XeF_2$) isotropic release etch of the amorphous-silicon layer 312 (such as a $XeF_2$ release process) is performed to transfer the opening 318 to the amorphous-silicon layer 312. In other embodiments, anisotropic etching to increase surface area is also contemplated.

Figure 3F:
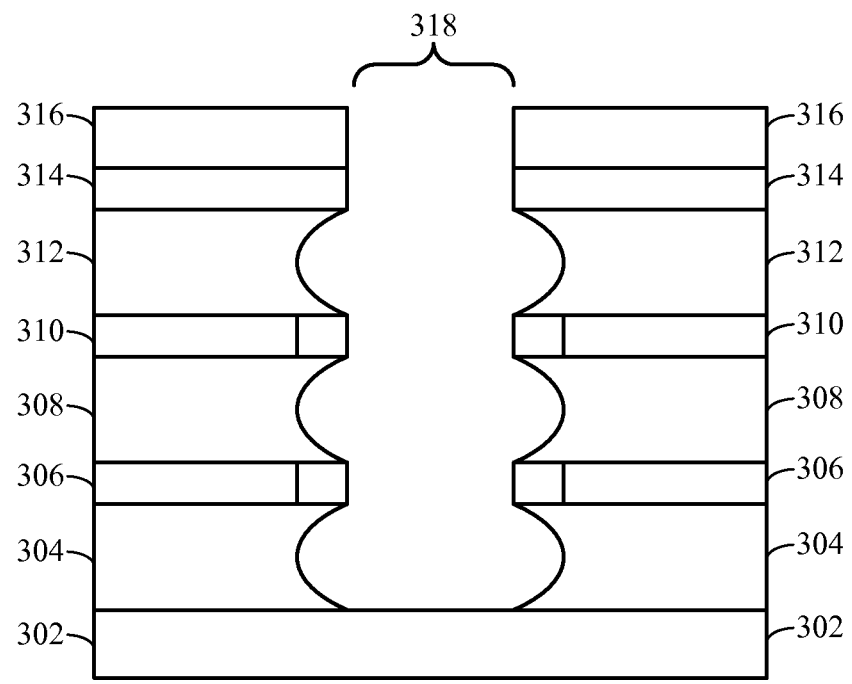

At block 230, it is determined if additional bilayers of silicon dioxide layers and amorphous-silicon layer are to be etched on the substrate. If additional bilayers exist, the process returns to block 220 to etch the remaining bilayers. FIG. 3F is a cross-sectional view illustrating an exemplary layer structure after etching the bilayers according to one embodiment. The opening 318 is transferred through the layers 310, 308, 306, 304. When no bilayers remain to be etched, the process continues to block 235.

Figure 3G:
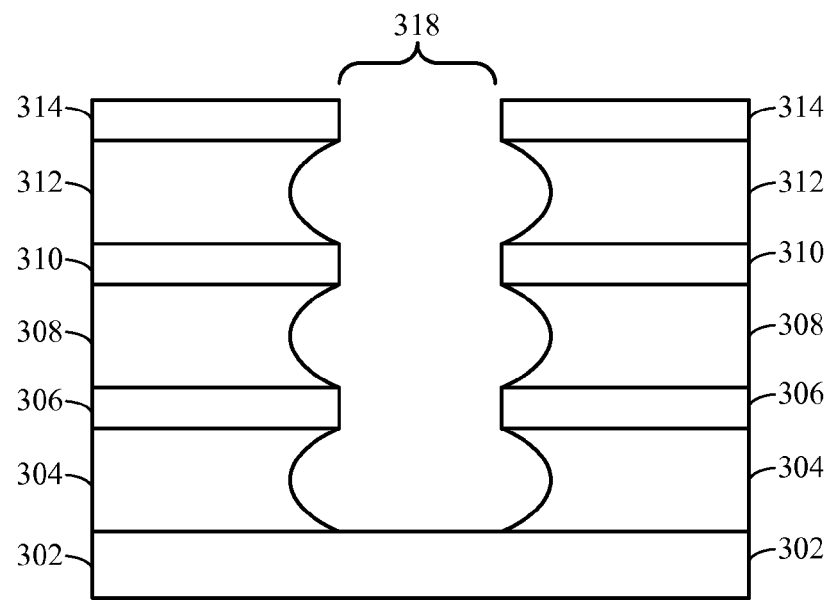

At block 235, the hard mask is removed. FIG. 3G is a cross-sectional view illustrating an exemplary layer structure according to one embodiment. The hard mask 316 is stripped with, for example, a wet chemical etch.

Figure 3H:
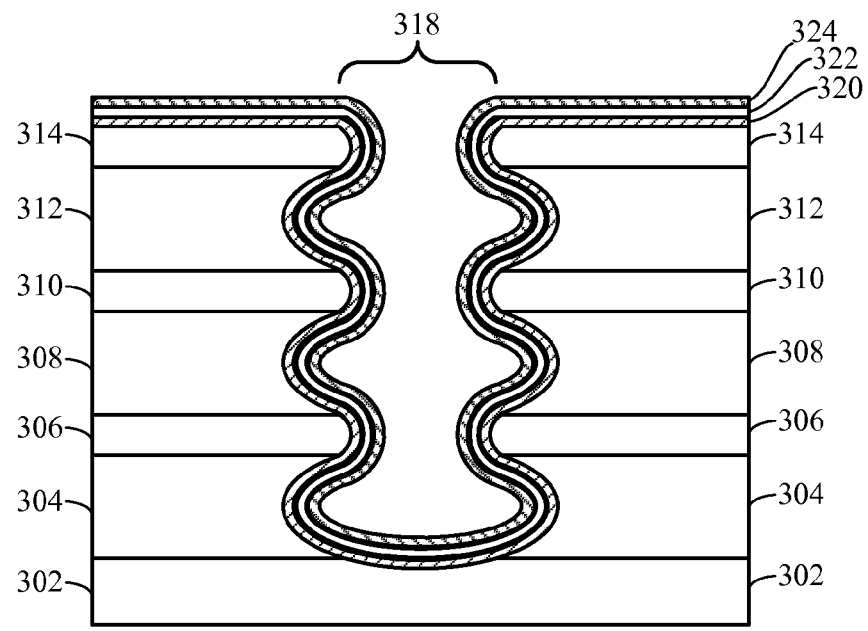

At block 240, the MIM capacitor is fabricated by depositing a first metal layer, a dielectric layer, and a second metal layer. FIG. 3H is a cross-sectional view illustrating an exemplary layer structure after deposition of the high density MIM capacitor according to one embodiment. A first conducting layer 320 is deposited on the sidewalls of the opening 318, followed by an insulating layer 322, and a second conducting layer 324. According to one embodiment, the layers 320, 322, 324 are deposited by atomic layer deposition (ALD).

The first conducting layer 320 and the second conducting layer 324 form electrodes of a capacitor. According to one embodiment, the conducting layers 320, 324 may be aluminum-silicon alloy, aluminum-copper alloy, aluminum-titanium-copper alloy, aluminum alloy, titanium nitride, molybdenum, or copper. According to one embodiment, the insulating layer 322 is zirconium oxide, hafnium oxide, aluminum oxide, tantalum oxide, or silicon dioxide. The surface area of the MIM capacitor formed by the layers 320, 322, 324 is increased by the isotropic ball shape of the sidewalls of the opening 318 in the amorphous-silicon layers 304, 308, 312.

Figure 4:
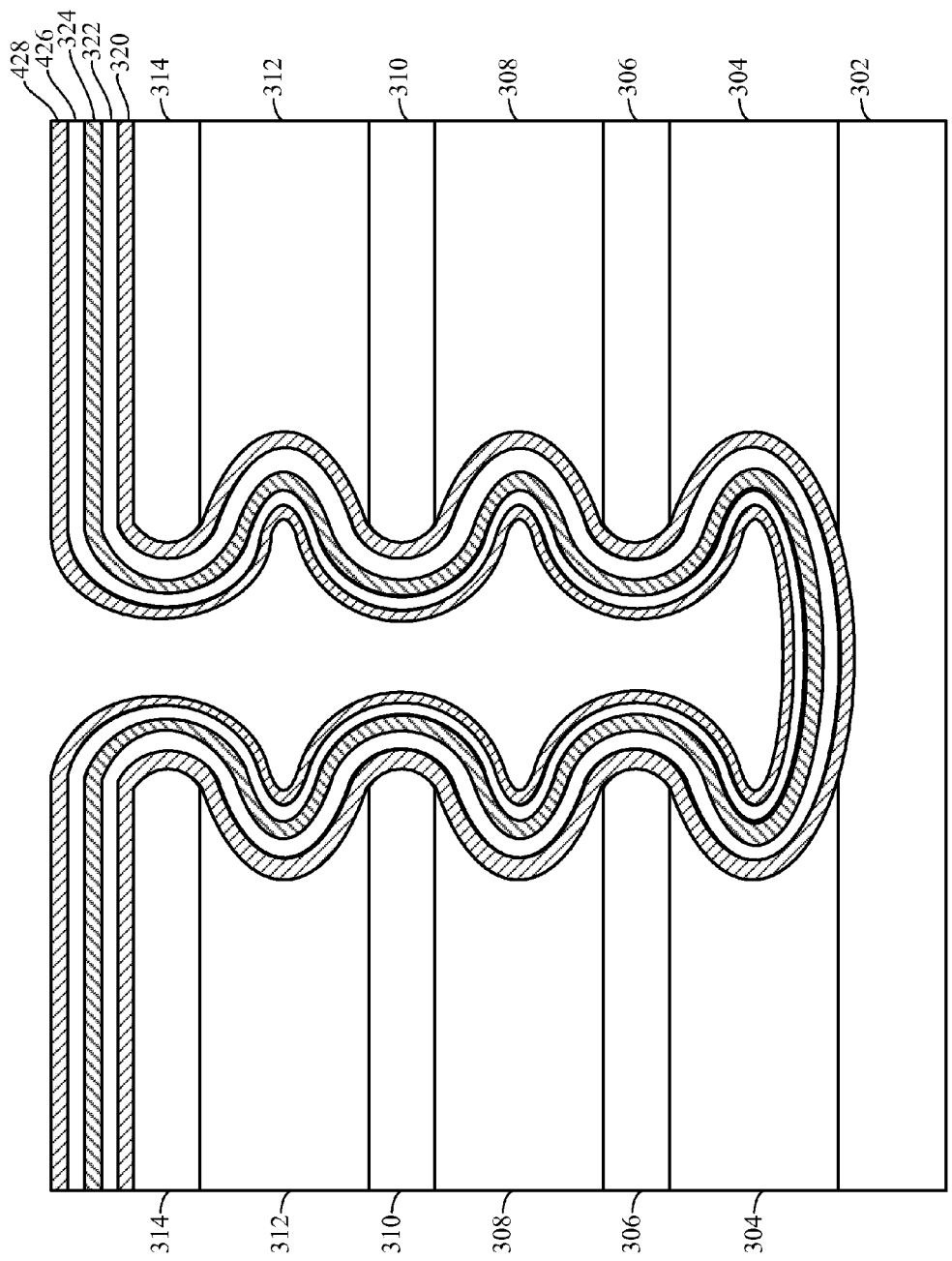
FIG. 4 is a cross-sectional view illustrating an exemplary stacking MIM capacitor according to one embodiment.

Additional layers may be deposited in a trench structure to form a stacking MIM capacitor. FIG. 4 is a cross-sectional view illustrating an exemplary stacking high density MIM capacitor structure according to one embodiment. A second insulator 426 is deposited on the second conducting layer 324, and a third conducting layer 428 is deposited on the second insulating layer 426. Although only two additional layers 426, 428 are shown, additional insulator and conducting layers may be deposited on the conducting layer 428. The conducting layers 320, 324, 428 form a parallel plate capacitor.

Capacitors manufactured in trenches by depositing a sequence of conducting layer, insulating layer, and conducting layer produce larger capacitance when the surface area of the capacitor is increased. Surface area in the trenches may be increased by creating isotropic balls on the sidewalls of the trenches. Alternatively, other isotropic shapes may be formed which also increases the surface area of the capacitor. The increased capacitance density of the capacitors manufactured in trenches with higher surface area sidewalls allows the die size of the capacitors to decrease. The capacitors may be used, for example, as capacitance in front-light modules of a Mirasol display, or in a radio frequency (RF) module. In a Mirasol display, the capacitors may be deposited in the reflective/diffractive via hole structures.

FIG. 5A is a block diagram showing an exemplary application of a high density MIM capacitor according to an aspect of the present disclosure. In the exemplary application, high density MIM capacitors provide bypass capacitance to reduce noise in a flip-chip application in which a CMOS die 502 is mounted to a printed circuit board (PCB) 504 via an intermediate substrate 506 (also referred to as a passive on glass (POG)). A power management integrated circuit (PMIC) 508 is directly coupled to the PCB. Numerous conductive paths including power supply conductors, for example, are connected between the PMIC and the CMOS die.

FIG. 5B is a schematic diagram of an illustrative conductive path 510 between the PMIC 508 and the CMOS die 502. The illustrative conductive path includes a first portion 512 on the PCB 504, a second portion 514 on the intermediate substrate 506 and a third portion 516 on the CMOS die 502. Placement of a bypass capacitor on the conductive path to reduce noise in the CMOS die 502 should be as close as possible to the path termination location on the CMOS die 502. In other words, the bypass capacitors could be provide at locations 512, 514, 516. However, it may be impossible or impractical to provide a capacitor on the CMOS die 502. The exemplary application according to the present disclosure allows a bypass capacitor to be located very near to the path termination location on the CMOS die 502. Similarly, the other locations 512, 514 for the bypass capacitors can be slightly adjusted, when appropriate In the exemplary application, a passive on glass (POG) structure serves as the intermediate substrate 506 upon which the CMOS die 502 is mounted. The POG structure 506 includes high density MIM capacitors according to aspects of the present disclosure. For example, the high density capacitors may be fabricated on a POG substrate 506 according to the present disclosure as a trench MIM structure, a stacking capacitor structure, or a hybrid stacking trench MIM structure. The POG structure 506 provides higher density capacitors than a silicon structure and thereby provides a shorter path length between the CMOS die 502 and a bypass capacitor on the intermediate substrate 506. The POG structure 506 is less expensive to fabricate than intermediate structures made from silicon or other materials.

Figure 6:
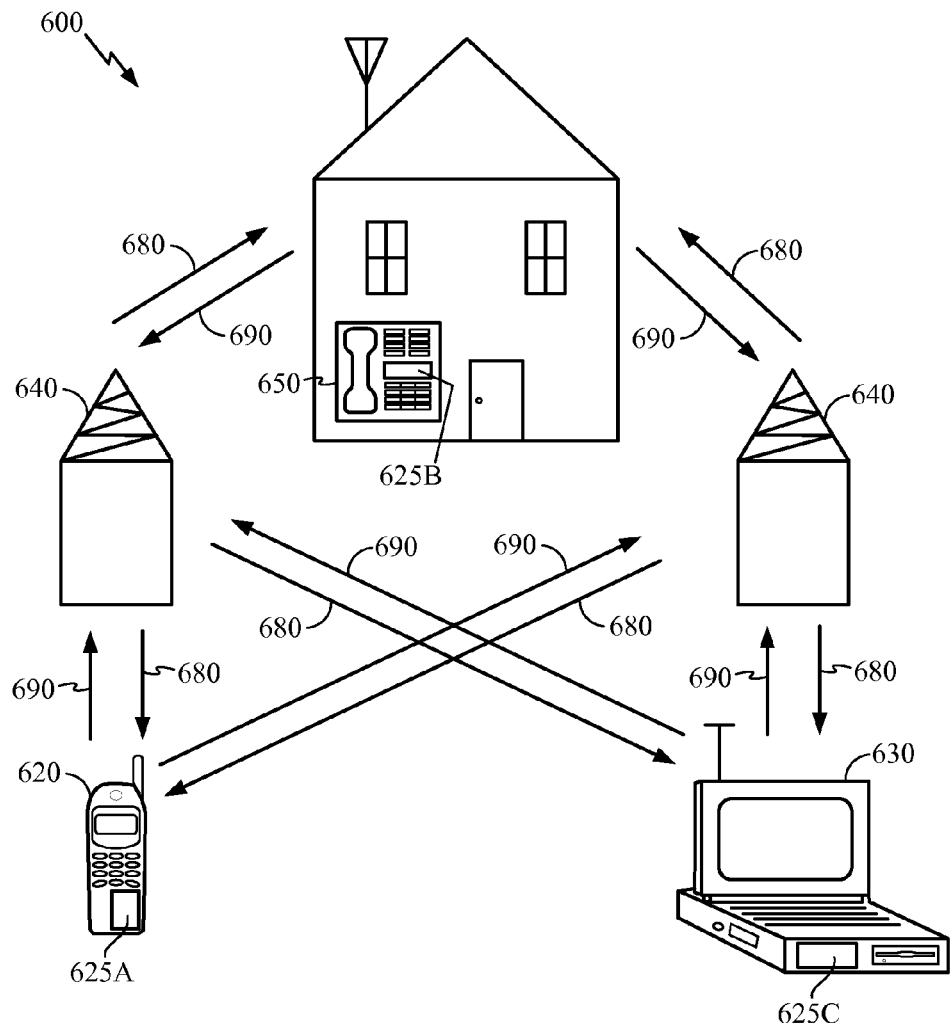
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 625B, that include the disclosed high density MIM capacitor. It will be recognized that any device containing an IC may also include the high density MIM capacitor structures disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes semiconductor dies having high density MIM capacitors.

Figure 7:
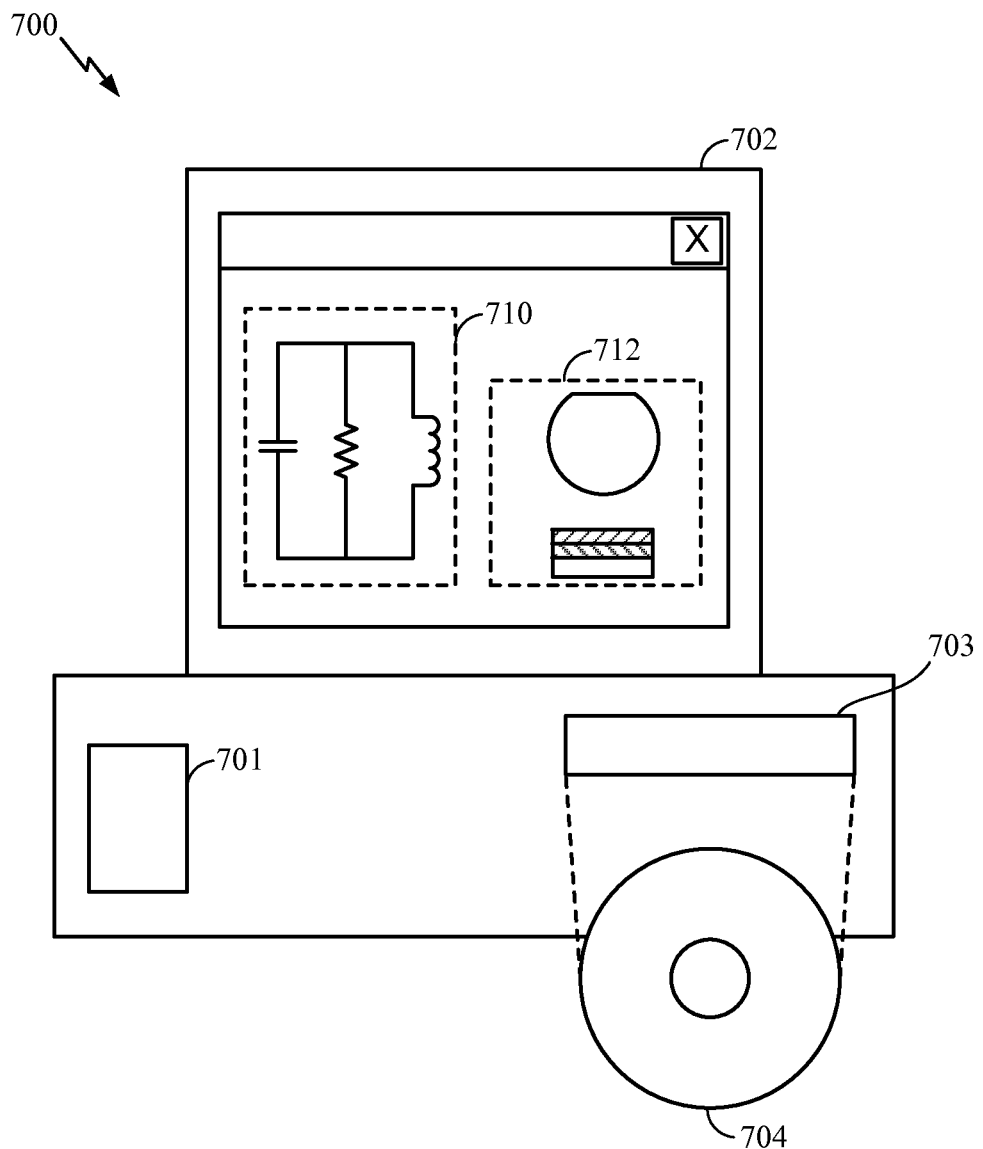
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, such as a high capacitance MIM capacitor as disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as a packaged integrated circuit having high capacitance MIM capacitor. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
   a substrate;
   a first bilayer deposited on the substrate, the first bilayer including a first bilayer layer made of a hard mask material and a second bilayer layer made of an isotropically etchable material;
   a trench in the first bilayer, the trench including a vertical portion extending through the first bilayer layer and a concave portion extending through the second bilayer layer and under a portion of the first bilayer layer; and
   a capacitor conforming to the vertical portion and the concave portion, the capacitor including:
   a first metal-insulator-metal (MIM) conducting layer deposited on the vertical portion and the concave portion,
   a first MIM insulating layer deposited on the first conducting layer, and
   a second MIM conducting layer deposited on the first insulating layer.

2. The apparatus of claim 1, further comprising:
   a second MIM insulating layer on the second conducting layer; and
   a third MIM conducting layer on the second insulating layer.

3. The apparatus of claim 1, further comprising:
   a second bilayer deposited on the first bilayer, in which the trench extends into the second bilayer.

4. The apparatus of claim 1, in which the first bilayer layer is a silicon dioxide layer and the second bilayer layer is an amorphous silicon layer.

5. The apparatus of claim 1, in which the capacitor is integrated into a mobile phone, a set top box, a music player, a video player, an entertainment unit, a navigation device, a computer, a hand-held personal communication systems (PCS) unit, a portable data unit, a fixed location data unit, and/or a Mirasol display.

6. The apparatus of claim 1, in which said substrate comprises a glass substrate.

7. The apparatus of claim 1, further comprising:
   a semiconductor die including a first portion of a conductive path coupled to the capacitor, and
   a printed circuit board including a second portion of the conductive path coupled to the capacitor.

8. The apparatus of claim 7, in which the capacitor is configured as a bypass capacitor on the conductive path.

9. A method, comprising:
   depositing a first bilayer on a substrate, the first bilayer including a first bilayer layer made of hard mask material and a second bilayer layer made of an isotropically etchable material;
   etching a trench in the first bilayer, the trench including a concave trench wall portion extending through the second bilayer layer and under a portion of the first bilayer layer;
   depositing a first metal-insulator-metal (MIM) conducting layer of a capacitor on concave trench wall portion;
   depositing a first MIM capacitor insulating layer of the capacitor on the first conducting layer; and
   depositing a second MIM conducting layer of the capacitor on the first insulating layer.

10. The method of claim 9, in which depositing the first bilayer comprises depositing an amorphous silicon layer and an insulating layer.

11. The method of claim 10, in which etching the trench comprises isotropically etching the amorphous silicon layer to form the concave trench portion.

12. The method of claim 9, further comprising:
    depositing a second MIM insulating layer on the second conducting layer; and
    depositing a third MIM conducting layer on the second insulating layer.

13. The method of claim 9, further comprising integrating the capacitor into a mobile phone, a set top box, a music player, a video player, an entertainment unit, a navigation device, a computer, a hand-held personal communication systems (PCS) unit, a portable data unit, a fixed location data unit, and/or a Mirasol display.

14. The method of claim 9, in which said substrate comprises a glass substrate.

15. The method of claim 9, further comprising:
coupling a semiconductor die including a first portion of a conductive path to the capacitor, and
coupling a printed circuit board including a second portion of the conductive path to the capacitor.

16. The method of claim 15, further comprising:
configuring the capacitor as a bypass capacitor on the conductive path.

17. A method, comprising the steps of:
depositing a plurality of bilayers on a substrate, each of the plurality of bilayers including an hard mask layer deposited over an amorphous silicon layer;
patterning a trench in the plurality of bilayers by isotropically etching each of the amorphous silicon layers to form a concave trench wall portion extending between each of the hard mask layers;
depositing a first conducting layer of a metal-insulator-metal (MIM) capacitor on the concave trench wall portion;
depositing a first capacitor insulating layer of the MIM capacitor on the first conducting layer; and
depositing a second conducting layer of the MIM capacitor on the first insulating layer.

18. The method of claim 17, further comprising the step of integrating the capacitor into a mobile phone, a set top box, a music player, a video player, an entertainment unit, a navigation device, a computer, a hand-held personal communication, systems (PCS) unit, a portable data unit, a fixed location data unit, and/or a Mirasol display.

19. An apparatus, comprising:
a substrate;
a first bilayer coupled to the substrate, the first bilayer including a first bilayer layer made of a hard mask material and a second bilayer layer made of an isotropically etchable material;
a trench in the first bilayer, the trench including a vertical portion extending through the first bilayer layer and a concave portion extending through the second bilayer layer and under a portion of the first bilayer layer; and
means for providing capacitance in the trench, conforming to the vertical portion and the concave portion.

20. The apparatus of claim 19, in which the first bilayer comprises at least one bilayer of an amorphous silicon layer and an insulating layer.

21. The apparatus of claim 19 in which the substrate comprises a glass substrate.

22. The apparatus of claim 19, integrated into at least one of a mobile phone, a set top box, a music player, a video player, an entertainment unit, a navigation device, a computer, a hand-held personal communication systems (PCS) unit, a portable data unit, a fixed location data unit, and a Mirasol display.

23. The apparatus of claim 1, in which the first bilayer layer comprises an anisotropically etchable material, and the second bilayer layer comprises an isotropically etchable material.

24. The apparatus of claim 1, in which the first bilayer is one of a plurality of stacked bilayers of the same materials:
each of the stacked bilayers includes a first bilayer layer and a second bilayer layer; and
the trench extends through the plurality of stacked bilayers, and the trench includes a concave trench wall portion extending through the second bilayer layer and under the first bilayer layer in each of the stacked bilayers.

25. The method of claim 9, further comprising:
depositing a plurality of bilayers on the substrate; and
etching the trench in the plurality of bilayers, the trench including a concave trench wall portion extending through a second bilayer layer of each of the plurality of bilayers and under a portion of first bilayer layer of each of the plurality of bilayers.

\* \* \* \* \*